(12) United States Patent
Sun et al.

(10) Patent No.: US 7,053,400 B2
(45) Date of Patent: May 30, 2006

(54) SEMICONDUCTOR DEVICE BASED ON SI-GE WITH HIGH STRESS LINER FOR ENHANCED CHANNEL CARRIER MOBILITY

(75) Inventors: Sey-Ping Sun, Fishkill, NY (US); David E. Brown, Pleasant Valley, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 10 days.

(21) Appl. No.: 10/838,330

(22) Filed: May 5, 2004

(65) Prior Publication Data

US 2005/0247926 A1     Nov. 10, 2005

(51) Int. Cl.
*H01L 31/072*     (2006.01)
(52) U.S. Cl. .......................... 257/19; 257/18
(58) Field of Classification Search ............... 257/19, 257/18, 15, 20, 24
See application file for complete search history.

(56) References Cited

U.S. PATENT DOCUMENTS

| | | | |
|---|---|---|---|
| 6,429,061 B1 * | 8/2002 | Rim ........................... | 438/198 |
| 6,573,172 B1 | 6/2003 | En et al. | |
| 6,709,935 B1 | 3/2004 | Yu | |
| 6,900,502 B1 * | 5/2005 | Ge et al. .................... | 257/347 |
| 2004/0045499 A1 | 3/2004 | Langdo et al. | |
| 2005/0224867 A1 * | 10/2005 | Huang et al. ............... | 257/327 |

OTHER PUBLICATIONS

Semiconductor one source definition of silicide and silicidation from semiconductorglossary.com.*
S.E. Thompson et al., "A Logic Nanotechnology Featuring Strained-Silicon" IEEE Electron Device Letters, IEEE Inc. New York, US, vol. 25, No. 4, Apr. 2004, pp. 191-193, XP001190370.
T. Ghani et al., "A 90nm High volume Manufacturing Logic Technology Featuring Novel 45nin Gate Length Strained Silicon CMOS Transistors" International Electron Devices Meeting 2003, IEDM, Technical Digest, Washington, Dc, Dec. 8, 2003, pp. 978-980, XP010684238.
S. Thompson et al., "A 90nm Logic TechnologyFeaturing 50nm Strained Silicon Channel Transistors, 7 Layers of Cu Interconnects, Low K 1LD, and 1/spl mu/m <2>. SRAM Cell", International Electron Devices Meeting 2002. IEDM Technical Digest, San Francisco, CA, Dec. 8-11, 2002, New York, NY: IEEE, US, Dec. 8, 2002, pp. 61-64, XP010625990.

* cited by examiner

*Primary Examiner*—David Nelms
*Assistant Examiner*—Thinh T Nguyen

(57) ABSTRACT

The carrier mobility in transistor channel regions of Si—Ge devices is increased by employing a stressed liner. Embodiments include applying a high compressive or tensile stressed film overlying relaxed source/drain regions. Other embodiments include applying a high compressively or high tensilely stressed film, after post silicide spacer removal, over gate electrodes and strained Si source/drain regions of P-channel or N-channel transistors, respectively.

9 Claims, 14 Drawing Sheets

SEMICONDUCTOR DEVICE BASED ON SI-GE WITH HIGH STRESS LINER FOR ENHANCED CHANNEL CARRIER MOBILITY

FIELD OF THE INVENTION

The present invention relates to micro-miniaturized semiconductor devices comprising transistors on silicon-germanium. The present invention is particularly applicable in fabricating transistors with enhanced channel carrier mobility.

BACKGROUND OF THE INVENTION

The relentless pursuit of miniaturized high speed semiconductor devices continues to challenge the limitations of conventional semiconductor materials and fabrication techniques. Conventional semiconductor devices typically comprise a plurality of active devices in or on a common semiconductor substrate, e.g., CMOS devices comprising at least a pair of PMOS and NMOS transistors in spaced adjacency. Current technology utilizes crystalline semiconductor wafers as substrates, such as a lightly p-doped epitaxial ("epi") layer of silicon (Si) grown on a heavily-doped, crystalline Si Substrate. The low resistance of the heavily-doped substrate is necessary for minimizing susceptibility to latch-up, whereas the light doping of the epi layer permits independent tailoring of the doping profiles of both the p-type and n-type wells formed therein as part of the fabrication sequence, thereby resulting in optimal PMOS and NMOS transistor performance.

The use of the very thin epi layers, i.e., several μm thick, is made possible by utilizing shallow trench isolation ("STI"), which advantageously minimizes up-diffusion of p-type dopant(s) from the more heavily-doped substrate into the lightly-doped epi layer. In addition, STI allows for closer spacing of adjacent active areas by avoiding the "bird's beak" formed at the edge of each LOCOS isolation structure. STI also provides better isolation by creating a more abrupt structure, reduces the vertical step from active area to isolation to improve gate lithography control, eliminates the high temperature field oxidation step that can cause problems with large diameter, i.e., 8 inch, wafers, and is scalable to future logic technology generations.

Substrates based on "strained silicon" have attracted interest as a semiconductor material which provides increased speeds of electron and hole flow therethrough, thereby permitting fabrication of semiconductor devices with higher operating speeds, enhanced performance characteristics, and lower power consumption. A very thin, tensilely strained, crystalline silicon (Si) layer is grown on a relaxed, graded composition of silicon-germanium (Si—Ge) buffer layer several microns thick, which Si—Ge buffer layer in turn is formed on a suitable crystalline substrate, e.g., a Si wafer or a silicon-on-insulator (SOI) wafer. The Si—Ge buffer layer typically contains 12 to 25 at. % Ge. Strained Si technology is based upon the tendency of the Si atoms, when deposited on the Si—Ge buffer layer, to align with the greater lattice constant (spacing) of Si and Ge atoms therein (relative to pure Si). As a consequence of the Si atoms being deposited on a substrate (Si—Ge) comprised of atoms which are spaced further apart, they "stretch" to align with the underlying Si and Ge atoms, thereby "stretching" or tensilely straining the deposited Si layer. Electrons and holes in such strained Si layers have greater mobility than in conventional, relaxed Si layers with smaller inter-atom spacings, i.e., there is less resistance to electron and/or hole flow. For example, electron flow in strained Si may be up to about 70% faster compared to electron flow in conventional Si. Transistors and IC devices formed with such strained Si layers can exhibit operating speeds up to about 35% faster than those of equivalent devices formed with conventional Si, without necessity for reduction in transistor size. Conventional practices based on strained silicon technology also involve epitaxially growing a relaxed silicon layer on a tensilely stressed silicon layer which is subsequently doped to form relaxed source/drain regions in the relaxed silicon layer.

The mobility of electrons is faster than the mobility of holes in conventional bulk silicon substrates. Accordingly, in conventional CMOS transistors, the drive current of the PMOS transistor is less than the drive current of the NMOS transistor creating an imbalance. This imbalance is exacerbated in CMOS transistors fabricated on or within a tensilely stressed active device area formed in a strained lattice semiconductor substrate, e.g., strained Si on Si—Ge, because the increase in electron mobility is greater than the increase in hole mobility.

As micro-miniaturization proceeds, there is an attendant need to increase the drive current of transistors, including transistors formed on various types of strained Si—Ge substrates, by enhancing carrier mobility. Accordingly, there exists a need for methodology enabling the fabrication of semiconductor devices comprising transistors formed on Si—Ge substrates with enhanced drive currents by increasing channel carrier mobility and the resulting semiconductor devices.

DISCLOSURE OF THE INVENTION

An advantage of the present invention is a method of fabricating a semiconductor device comprising transistors on Si—Ge substrates with enhanced drive currents.

Another advantage of the present invention is a semiconductor device comprising transistors based on Si—Ge substrates with enhanced drive currents.

Additional advantages and other aspects and features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are obtained in part by a semiconductor device comprising: a substrate comprising a layer of silicon (Si) having a strained lattice on a layer of silicon-germanium (Si—Ge); a transistor comprising source/drain regions and a gate electrode over the substrate with a gate dielectric layer therebetween; and a stressed dielectric liner over side surfaces of the gate electrode and over the source/drain regions.

Another advantage of the present invention is a method of manufacturing a semiconductor device, the method comprising: forming a substrate comprising a layer of silicon (Si) having a strained lattice on a layer of silicon-germanium (Si—Ge); forming a transistor comprising source/drain regions and a gate electrode, having an upper surface and side surfaces, over the substrate with gate dielectric layer therebetween; and forming a stressed dielectric liner over the side surfaces of the gate electrode and over the source/drain regions.

Embodiments of the present invention comprise forming dielectric sidewall spacers on side surfaces of the gate electrode, such as an oxide liner and a nitride layer thereon, epitaxially growing a relaxed Si layer on the strained Si layer, forming source/drain regions in the relaxed Si layer and then depositing the stressed dielectric liner on the sidewall spacers, on the relaxed source/drain regions and on a portion of the strained Si layer between the sidewall spacers and raised source/drain regions.

Embodiments of the present invention also include forming dielectric sidewall spacers on side surfaces of the gate electrode, forming source/drain regions in the strained Si layer, forming a metal silicide layer on the upper surface of the gate electrode and a metal silicide layer on the source/drain regions, removing the dielectric sidewall spacers to expose a portion of the strained Si layer adjacent the side surfaces of the gate electrode, and then forming the stress dielectric liner on the metal silicide layer, on the upper surface of the gate electrode, on the side surfaces of the gate electrode, on the adjacent exposed portions of the strained Si layer, and on the silicide layer overlying the source/drain regions.

In embodiments of the present invention comprising N-channel transistors, the stressed dielectric liner exhibits high tensile stress. In embodiments of the present invention comprising P-channel transistors, the stressed dielectric liner exhibits high compressive stress. The stressed dielectric liner may comprise a layer of silicon nitride, silicon carbide or silicon oxynitride, at a thickness of about 200 Å to about 1000 Å.

Embodiments of the present invention include fabricating semiconductor devices comprising complimentary MOS (CMOS) transistors, with a compressive film on the PMOS transistor and a tensile film on the NMOS transistor. According to one aspect of this invention, process flow includes depositing a compressive stressed nitride film over both the NMOS and PMOS transistors, and then depositing a thin buffer film, such as an oxide or oxynitride film, over both the NMOS and PMOS transistors. Selective etching is then conducted to remove the oxide and compressive stressed nitride films from the NMOS transistor while masking the PMOS transistor. A tensile stressed nitride film is then deposited over both the NMOS and PMOS transistors, and then selectively etched away from the PMOS transistor. The resulting CMOS device comprises an NMOS transistor with a tensile stressed film thereon and a PMOS transistor with a compressive stress film thereon.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

In FIGS. 1 and 2, similar features or elements are denoted by similar reference characters; in FIGS. 3 through 6, similar features or elements are denoted by similar reference characters; and in FIGS. 7 through 14, similar features or elements are denoted by similar reference characters.

DESCRIPTION OF THE INVENTION

Figure 1:
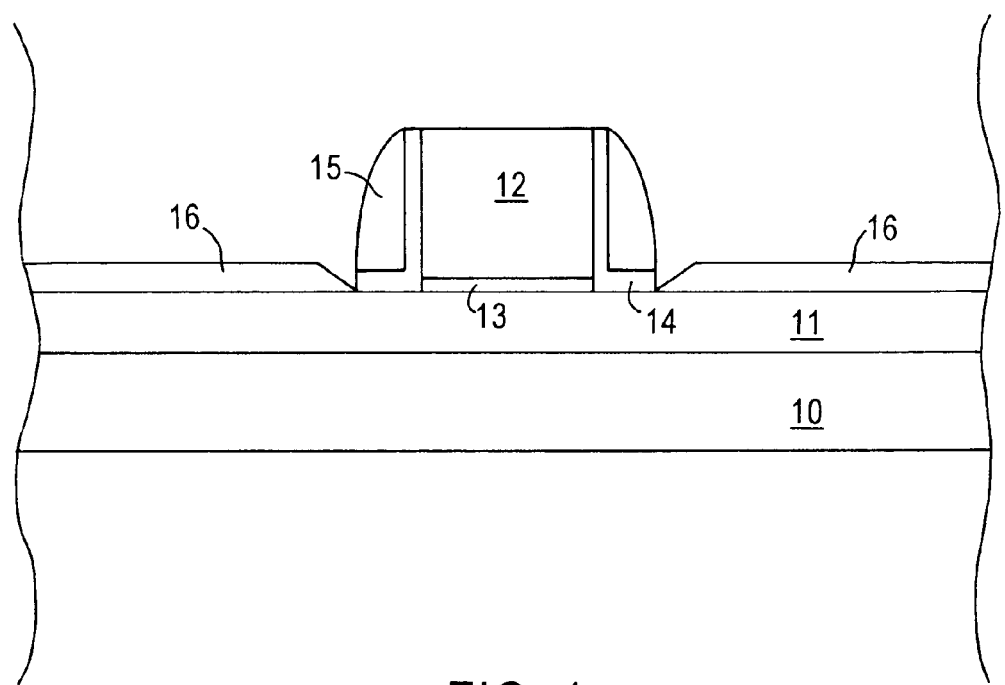
FIGS. 1 and 2 schematically illustrate sequential phases of a method in accordance with an embodiment of the present invention.
Figure 2:
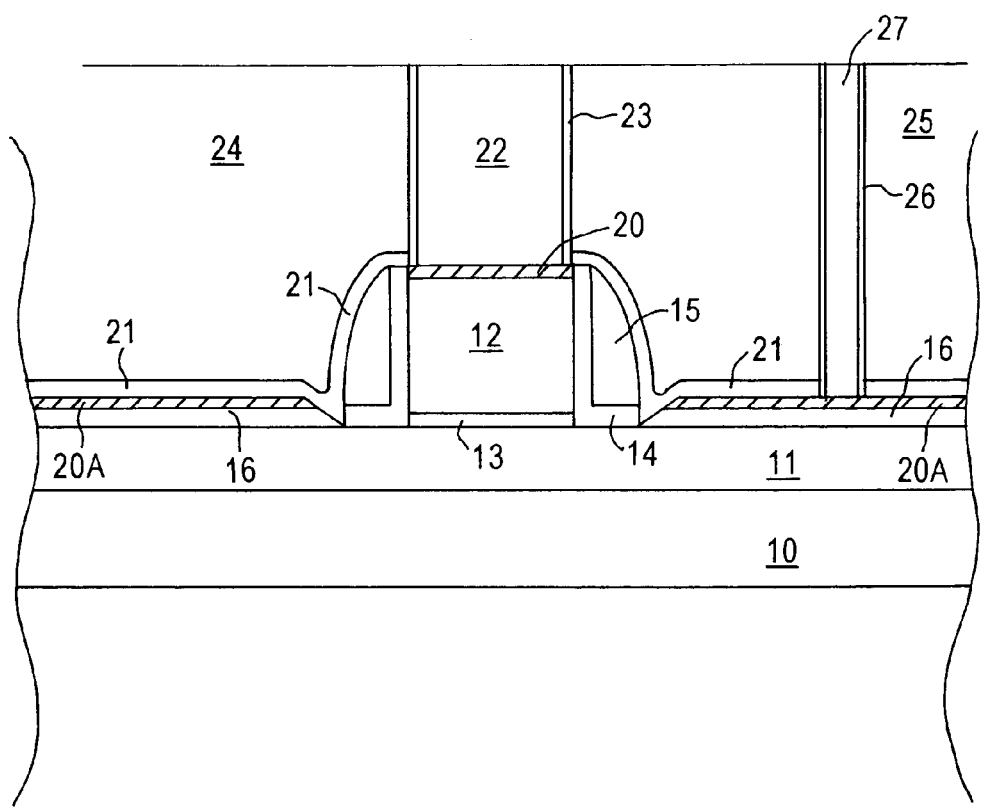
Figure 3:
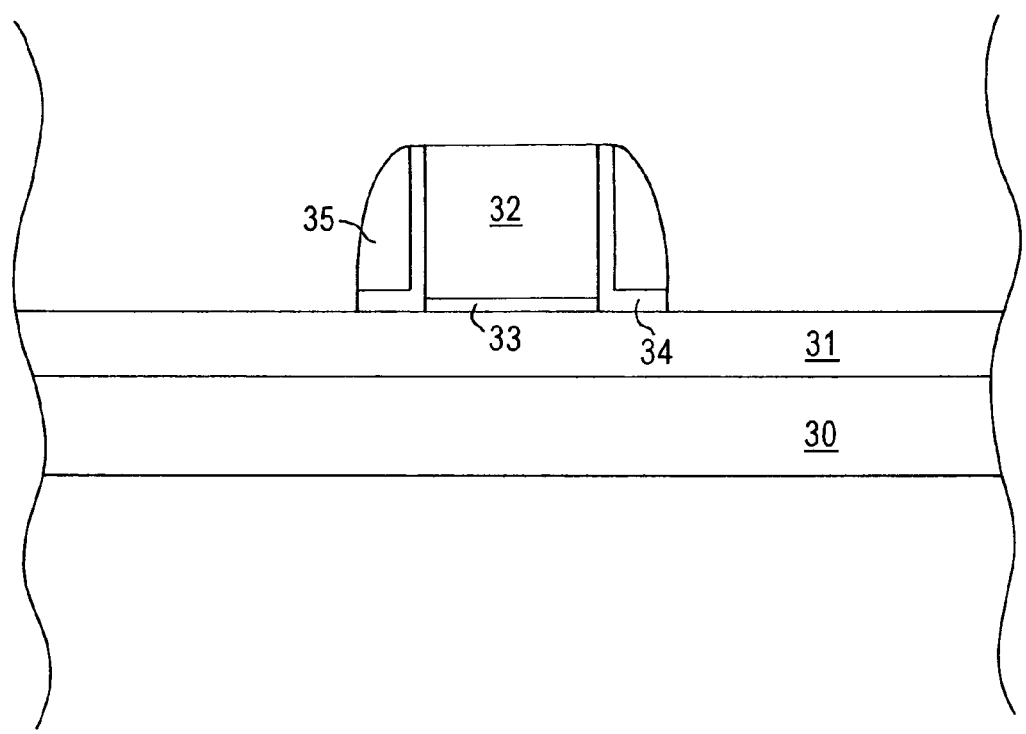
FIGS. 3 through 6 schematically illustrate sequential phases of a method in accordance with another embodiment of the present invention.

Transistors built on Si—Ge substrates involve different considerations than those built on bulk silicon substrates. Because of the large thickness of silicon substrates, stressed films deposited thereon tend to affect the substrate with a stress opposite to that exhibited by the film. For example, if a tensile stressed film is deposited on a bulk silicon substrate, compressive stress is imparted to the substrate and, hence, a channel region. However, typically, and in accordance with embodiments of the present invention, Si—Ge substrates are formed with a strained silicon layer having a thickness of about 200 Å to about 300Å. Relaxed source/drain regions may be formed thereon at a thickness of up to about 400 Å. Thus, the thickness of the strained Si layer and drain/source regions together typically does not exceed 800 Å. As a result, the strained Si layer, even together with a relaxed Si layer, is relatively transparent to the type of stress exhibited by a film deposited thereon. Accordingly, a tensile stressed layer deposited on a strained Si layer, or a relaxed Si layer formed on a strained Si layer, would also impart tensile stress to a channel region formed therein; and a compressive stressed layer deposited on such a thin Si layer or layers imparts compressive stress to a channel region formed therein; whereas, in bulk substrates, the opposite would occur.

The present invention addresses and solves the problem of increasing the drive current of transistors based on strained Si substrates in a cost effective and efficient manner by significantly enhancing the channel carrier mobility. The present invention stems from the recognition that the channel carrier mobility of transistors based on strained Si substrates can be increased by applying a stress thereto. In forming P-channel transistors, channel carrier mobility is enhanced by applying a stressed dielectric layer exhibiting high compressive stress for increasing hole mobility. In N-channel transistors, channel carrier mobility is significantly increased by applying a stressed layer exhibiting high tensile stress for increasing electron mobility. Stressed dielectric layers may be applied to transistors wherein the source/drain regions are formed within the strained Si layer, and to transistors having relaxed source/drain regions formed on strained Si layers. The stressed dielectric layer may comprise silicon carbide, silicon nitride or silicon oxynitride, and may be deposited by plasma enhanced chemical vapor deposition (PECVD) at a thickness of about 200 Å to about 1000 Å. Conventional PECVD conditions may be employed for deposition of a highly compressive or highly tensile dielectric layer. In depositing a stressed dielectric layer exhibiting high compressive stress, both high frequency and low frequency power are applied. When depositing a stressed dielectric layer exhibiting high tensile stress, the low frequency power is significantly reduced. In depositing a dielectric layer exhibiting high tensile stress, a tensile stress is applied to the underlying strained or relaxed Si layer. In applying a layer exhibiting high compressive stress, a compressive stress is applied to the underlying strained or relaxed Si layer.

For example, a stressed conformal silicon nitride layer exhibiting a high compressive stress, e.g., greater than 1 GPa, may be deposited at: a silane ($SiH_4$) flow rate of 200 to 500 sccm; a nitrogen ($N_2$) flow rate of 2,000 to 10,000 sccm; an ammonia ($NH_3$) flow rate of 2,500 to 5,000 sccm; a $SiH_4/NH_3$ ratio of 0.2 to 0.04, a temperature of 350° C. to 550° C.; a pressure of 1 to 6 Torr; a high frequency power of 70 to 300 watts; a low frequency power of 20 to 60 watts and an electrode (shower head) spacing of 400 to 600 mils. A silicon nitride layer exhibiting a high tensile stress, e.g., greater than 1 GPa, may be deposited at a $SiH_4$ flow rate of 50 to 500 sccm; an $NH_3$ flow rate of 1,500 to 5,000 sccm; a $N_2$ flow rate of 4,000 to 30,000 sccm; a $SiH_4/NH_3$ ratio of 0.2 to 0.04, a temperature of 350° C. to 550° C., a pressure of 2 to 10 Torr; a high frequency power of 40 to 300 watts and a low frequency power of 0 to 10 watts.

In other embodiments of the present invention, a dielectric layer exhibiting high tensile stress may be formed by depositing the dielectric layer by chemical vapor deposition and then treating the deposited dielectric layer with ultraviolet or electron beam radiation to increase its tensile stress.

In accordance with embodiments of the present invention, the stressed layer is applied at a relatively low temperature. Accordingly, the present invention enables deposition of a tensile or compressive stressed layer in transistors having nickel silicide layers formed on source/drain regions and gate electrodes, without exceeding the thermal stability limits of the nickel silicon layers. The present invention is also applicable to transistors comprising other metal silicides, such as cobalt silicide. In cobalt silicidation, a separate layer of silicon is deposited prior to depositing a layer of cobalt and implementing silicidation.

An embodiment of the present invention is schematically illustrated in FIGS. 1 through 6. Adverting to FIG. 1, a layer of strained Si 11 is formed on a layer of Si—Ge 10. It should be understood that Si layer 11 may be entirely strained or strained locally in the source/drain regions as in conventional practices, and that embodiments of the present invention encompass both types of strained Si layers. A gate electrode 12 is formed over strained Si layer 11 with a gate dielectric layer 13 therebetween. Sidewall spacers are then formed comprising an L-shaped oxide liner 14, e.g., silicon oxide, and a nitride layer 15, e.g., silicon nitride, thereon. A relaxed Si layer 16 is then epitaxially grown on strained Si layer 11 and source/drain regions formed therein, as by doping extending the source/drain regions into strained Si layer 11. A metal silicide layer 20, 20A, such as nickel silicide, is formed on the upper surface of gate electrode 12 on an relaxed source/drain region 16, respectively. A stressed dielectric liner 21 is then formed on the sidewall spacers, silicides 20, 20A, and between the oxide liner 14 and relaxed source/drain region 16 on the Si layer 11. In embodiments of the present invention wherein the Si layer is strained locally at the source/drain regions, the stressed dielectric layer 21 imparts strain 20 to silicon layer 11 under the gate electrode and under the spacers, thereby advantageously increasing channel carrier mobility. In embodiments wherein the entire Si layer 11 is strained, the stressed dielectric layer further increases strain in the channel region under the gate electrode and spacers, thereby further increasing channel carrier mobility. Stressed dielectric layer 21 can be, for example, silicon nitride deposited by PECVD exhibiting a high compressive or tensile stress. Additional features illustrated in FIG. 2 include tungsten plug 22 and barrier metal 23, e.g., titanium nitride, filling an opening in interlayer dielectric 24, and tungsten plug 25 and barrier metal wire 26, such as titanium nitride, filing contact hole 27 in interlayer dielectric 24. The stress applied by the highly stressed dielectric layer 21 enhances channel carrier mobility, thereby increasing the drive current of the transistor.

Another embodiment of the present invention is schematically illustrated in FIGS. 3 through 6. Adverting to FIG. 3, strained Si layer 31 is formed over Si—Ge layer 30. As in the previous discussed embodiment, Si layer 31 may be globally strained or locally strained under the source/drain regions. Gate electrode 32 is formed over strained Si layer 31 with a gate dielectric layer 33 therebetween. A sidewall spacer comprising an oxide liner 34, as at a thickness of about 60 Å to about 600 Å, is formed on side surfaces of the gate electrode 32 and on a portion of the upper surface of strained Si layer 31. It should be appreciated that liner 34 may be deposited by ALD and may also comprise silicon nitride. Silicon oxide liner advantageously prevents consumption of the gate electrode by silicidation on the side surfaces thereof, and advantageously prevents a subsequently formed thin layer of nickel silicide on the silicon nitride sidewall spacers from contacting the nickel silicide contact layer on the upper surface of the gate electrode and/or from contacting the nickel silicide contact layers on the upper surface of the strained Si layer 31, thereby preventing nickel silicide bridging along the silicon nitride sidewall spacers.

Figure 4:
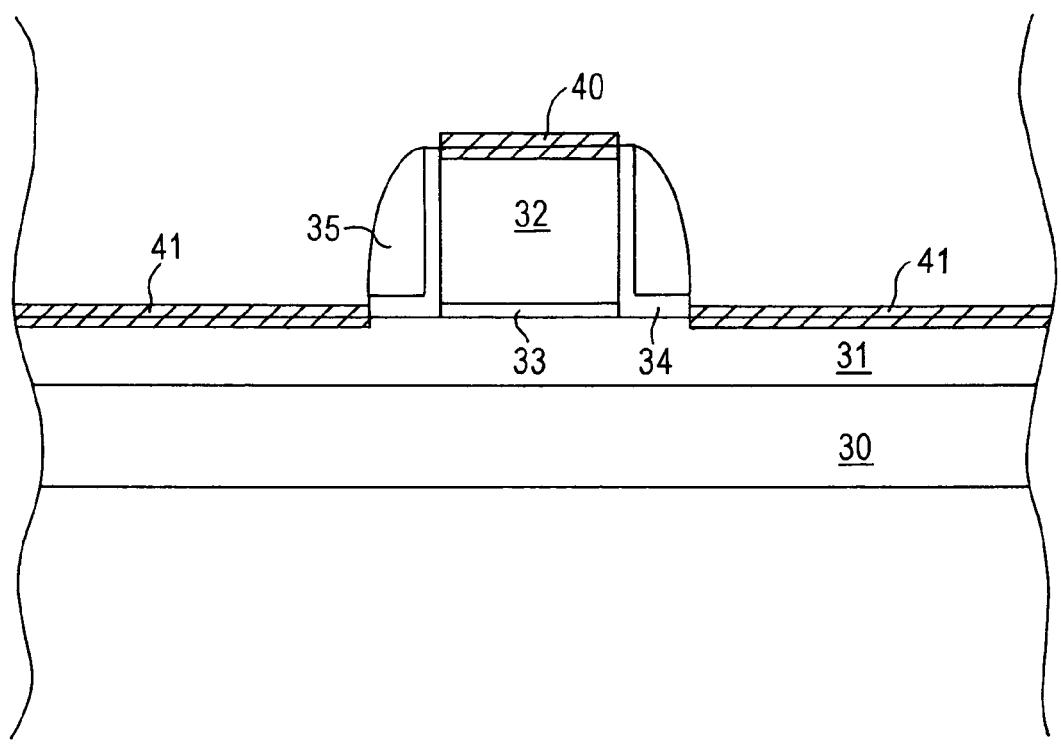

Silicon nitride spacers 35 are then formed on silicon oxide liner 34 as by employing PECVD followed by etching. Subsequently, silicidation is implemented, as by forming a layer of nickel silicide 40 on the upper surface of gate electrode 32, as illustrated in FIG. 4, and by forming a layer of nickel silicide 41 on the source/drain region formed in the strained Si layer 31 or strained portion of silicon layer 31.

Figure 5:
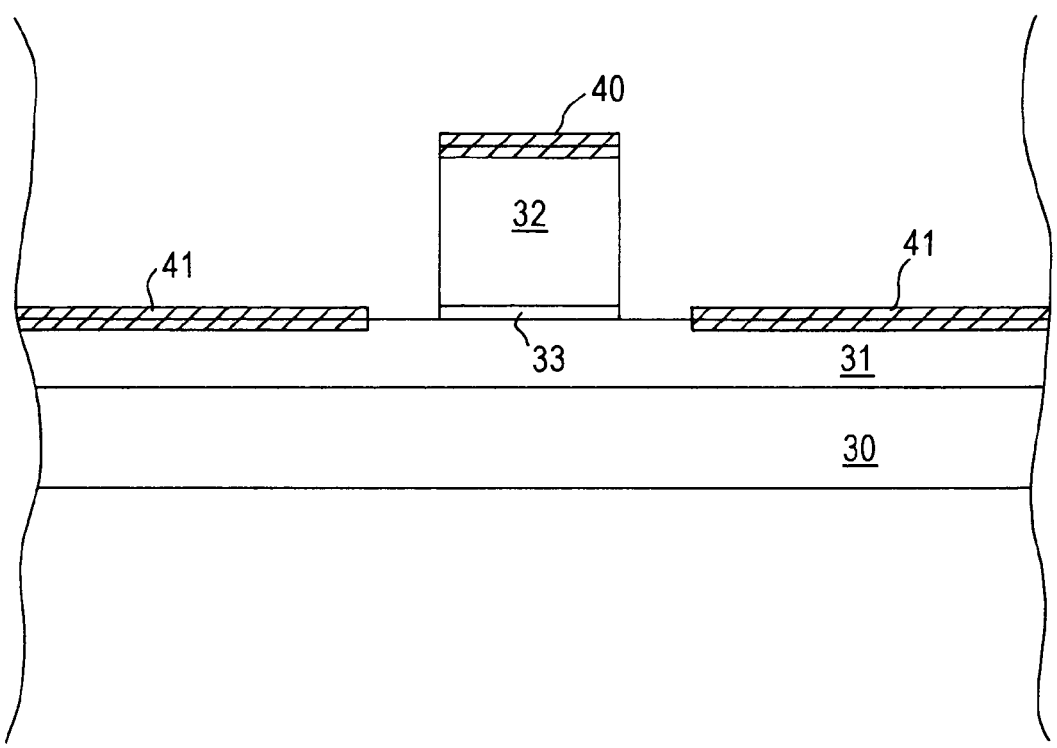
Figure 6:
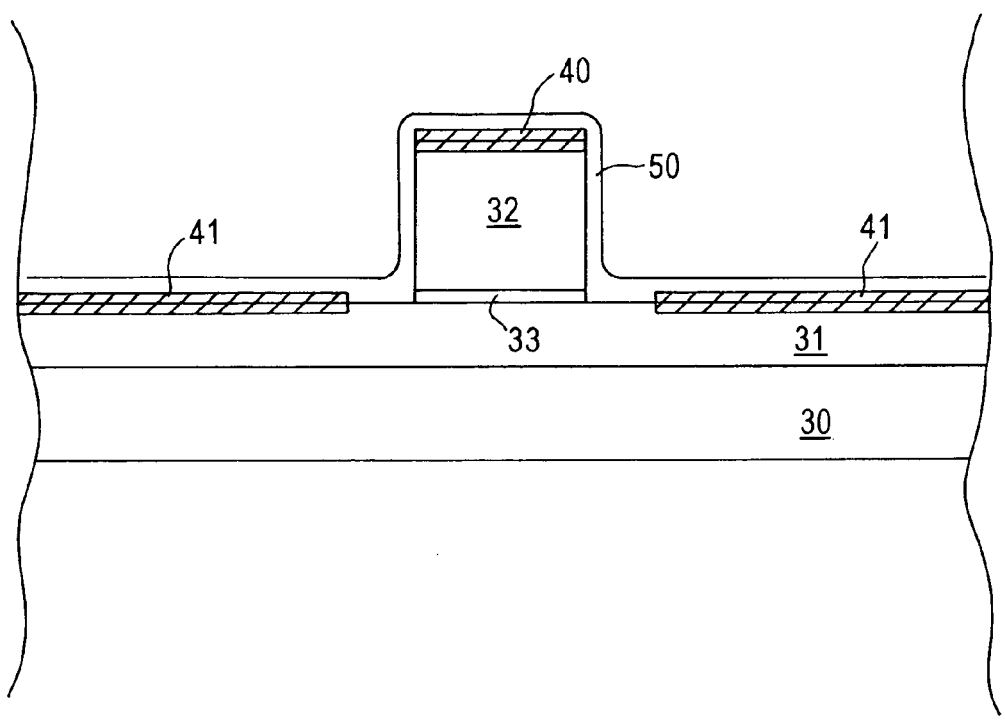
Figure 7:
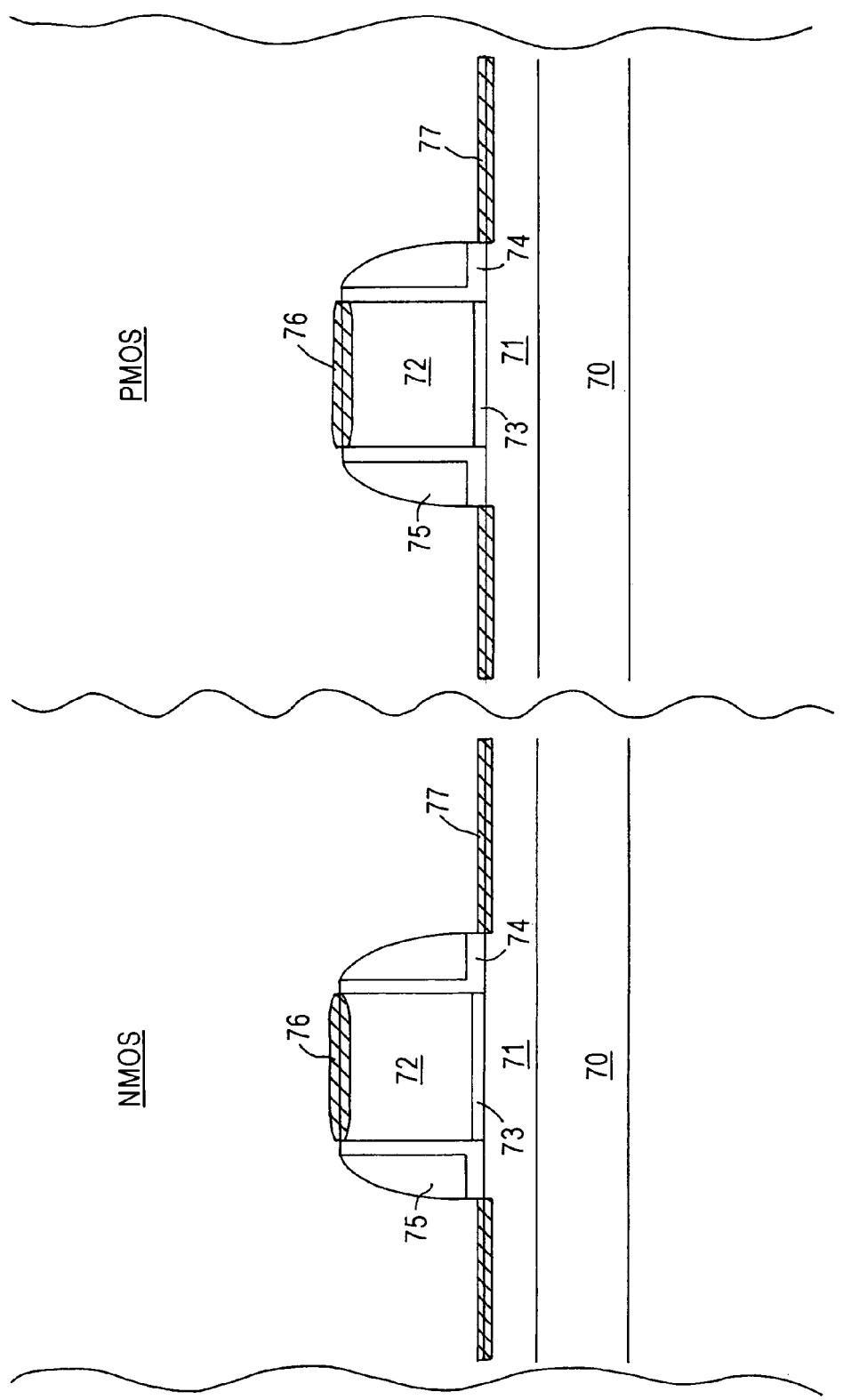
FIGS. 7 through 14 schematically illustrate sequential phases of a method in accordance with another embodiment of the present invention.

As illustrated in FIG. 5, the liner and sidewall spacers are then removed exposing a portion of the upper surface of strained Si layer 31 between the silicide layers 41 and the side surfaces of gate electrode 32, with a very thin oxide layer thereon, e.g., less 50 Å, serving as a buffer layer. A highly stressed dielectric layer 50 is then deposited, such as a silicon nitride layer exhibiting high compressive stress, by PECVD, as shown in FIG. 6. The highly stressed dielectric layer 50 serves to increase channel hole mobility, thereby increasing the drive current.

Another embodiment of the present invention is schematically illustrated in FIGS. 7 through 14. Adverting to FIG. 7, a CMOS device is schematically illustrated comprising an NMOS transistor portion at the left and a PMOS transistor portion on the right, wherein similar features are denoted by similar reference characters. Strained Si layer 71 is formed over Si—Ge layer 70. As in previous discussed embodiments, Si layer 71 may be globally strained or locally strained in the source/drain regions. Gate electrode 72 is formed over strained Si layer 71 with a gate dielectric layer 73 therebetween. A sidewall spacer comprising an oxide liner 74, as at a thickness of about 60 Å to about 600 Å, is formed on side surfaces of gate electrode 72 and on a portion of the upper surface of strained Si layer 71. Silicon oxide liner 74 can be formed in the same manner as discussed with respect to silicon oxide liner 34 in FIG. 3. Silicon nitride spacers 75 are then formed on silicon oxide liner 74, as by employing PECVD followed by etching. Subsequently, silicidation is implemented, as by forming a layer of nickel silicide 76 on the upper surface of gate electrodes 72 and by forming a layer of nickel silicide 77 on the source/drain regions formed on the strained Si layer 71.

Figure 8:
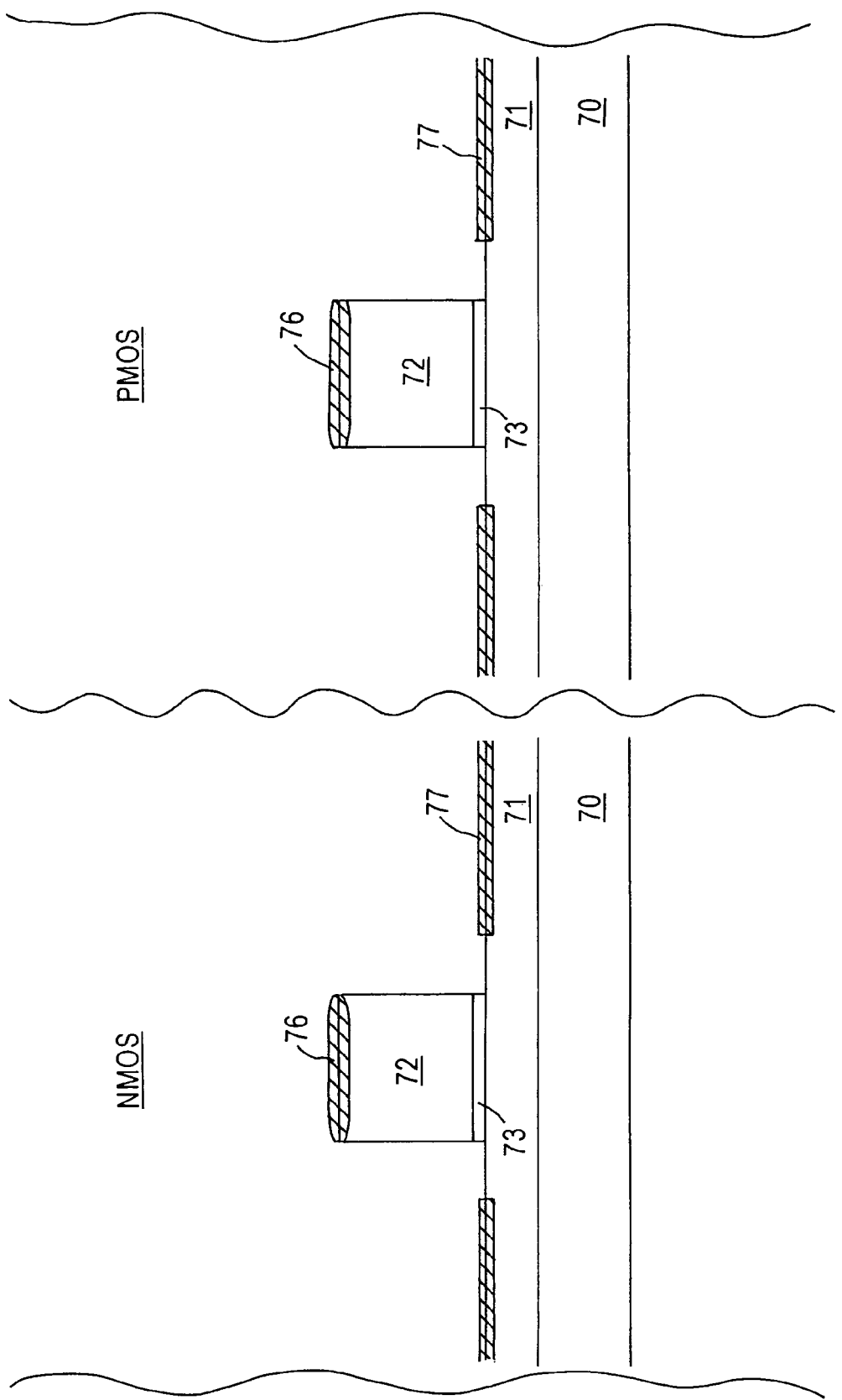
Figure 9:
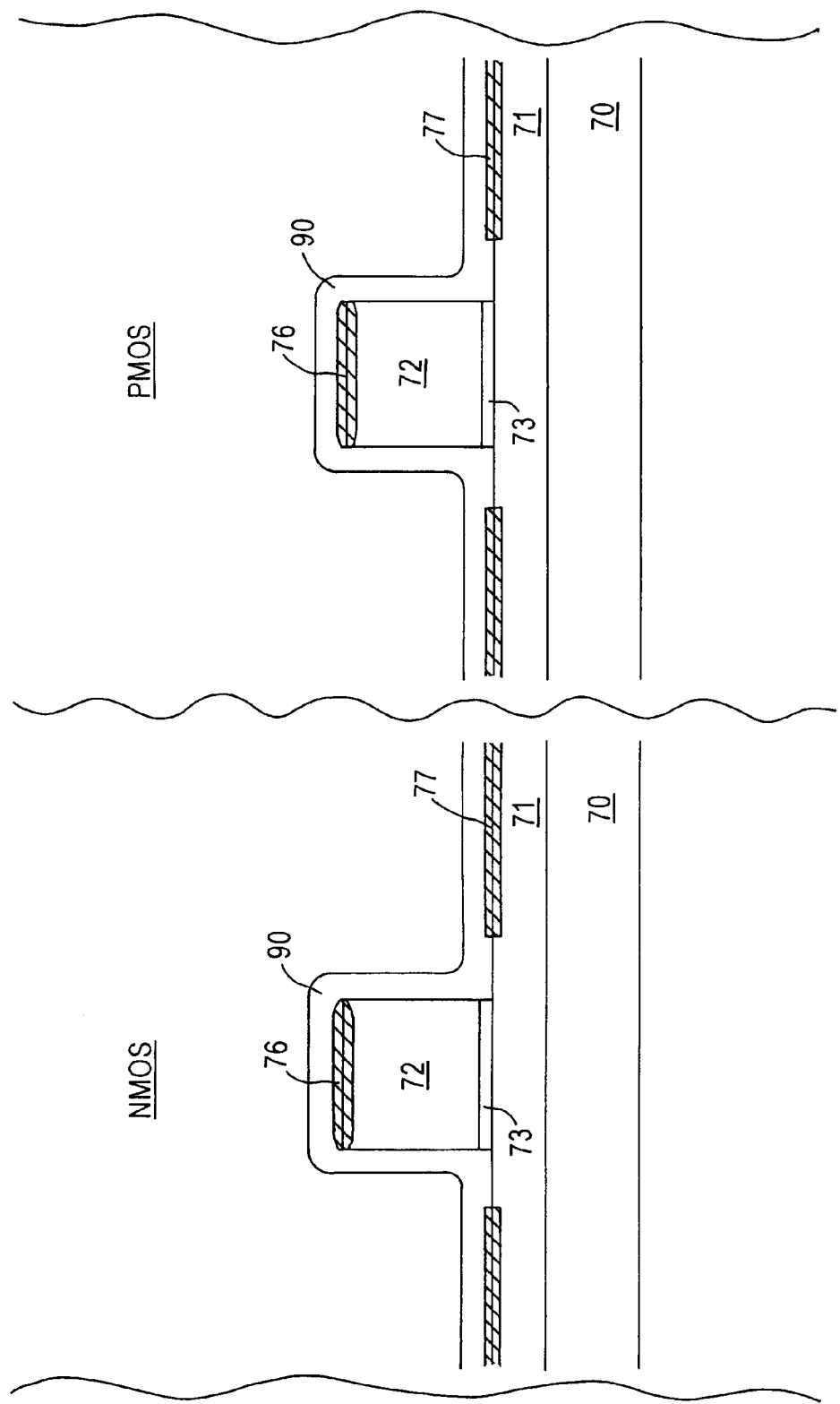
Figure 10:
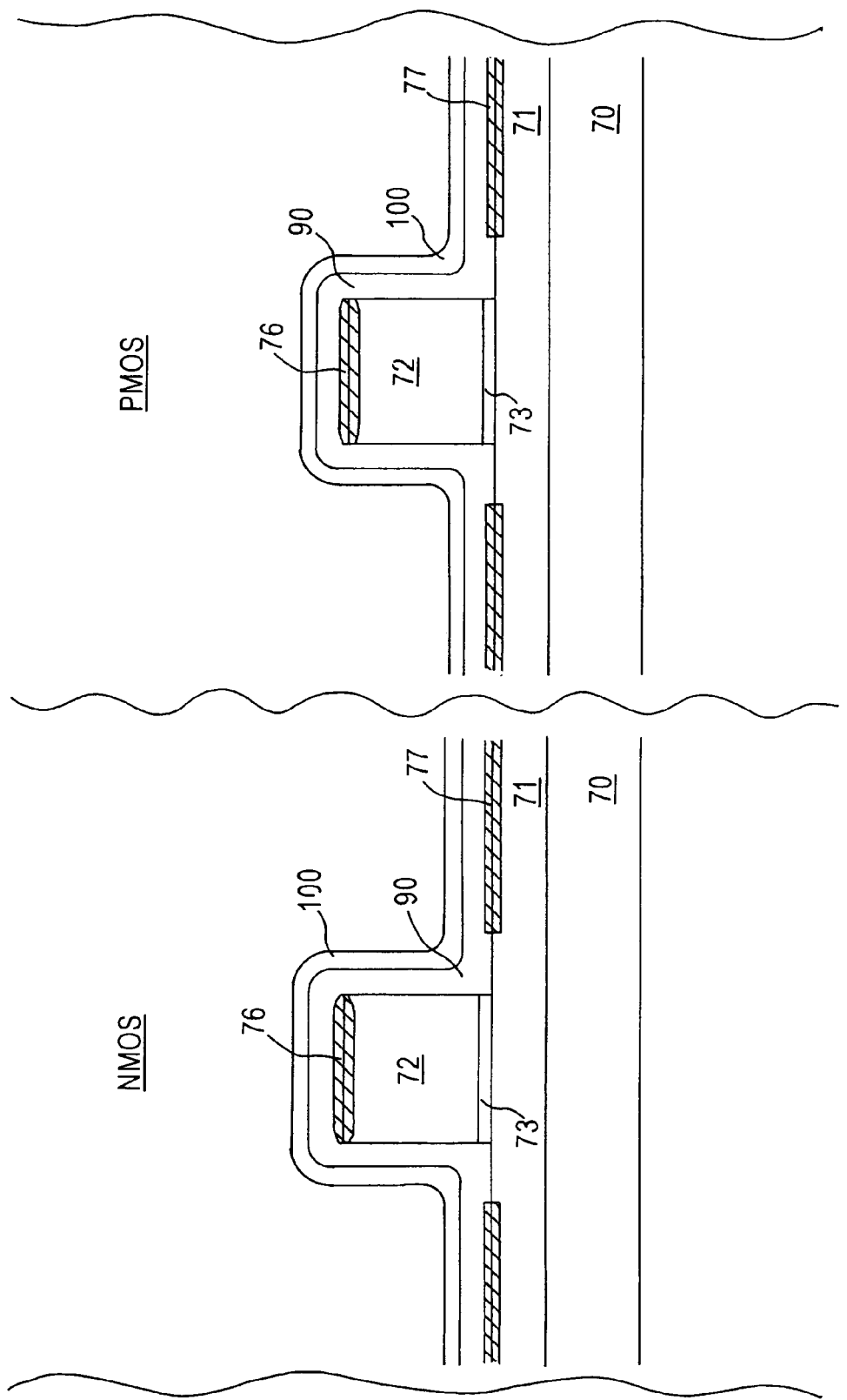

As illustrated in FIG. 8, liner 74 and sidewall spacer 75 are removed from each transistor exposing a portion of the upper surface of strained Si layer 71 between silicide layers 77 and the side surfaces of gate electrode 72. A highly compressive stressed silicon nitride film 90, having a compressive stressed greater than 1.5 GPa, is then deposited over both the NMOS and PMOS transistors as illustrated in FIG. 9. Deposition of highly compressive stressed silicon nitride film 90 may be implemented at a temperature of about 400° C. to about 480° C., at a $SiH_4$ flow rate of about 200 to about 300 sccm, an $NH_3$ flow rate of about 3,000 to about 4,000 sccm, a $N_2$ flow rate of about 3,500 to about 4,500 sccm, a pressure of about 2 to about 6 Torr, a shower head spacing of about 400 to about 600 mils, a high frequency RF power of about 60 to about 100 watts, a low frequency RF power of about 40 watts to about 90 watts, followed by $NH_3/N_2$ plasma treatment with $NH_3$ at a flow rate of about 500 to about 1500 sccm and with $N_2$ at a flow rate of about 2,000 to about 4,000 sccm, at a high frequency RF power of about 100 watts to about 600 watts, and a low frequency RF power of about 20 watts to about 60 watts for about 20 to about 60 seconds. Multiple layer deposition and plasma treatment further increases compressive stress. Subsequently, a thin oxide or oxynitride film 100 is deposited, as illustrated in FIG. 10, by a conventional CVD process. Typically oxide or oxynitride film 100 is deposited at a thickness of about 30 Å to about 60 Å.

Figure 11:
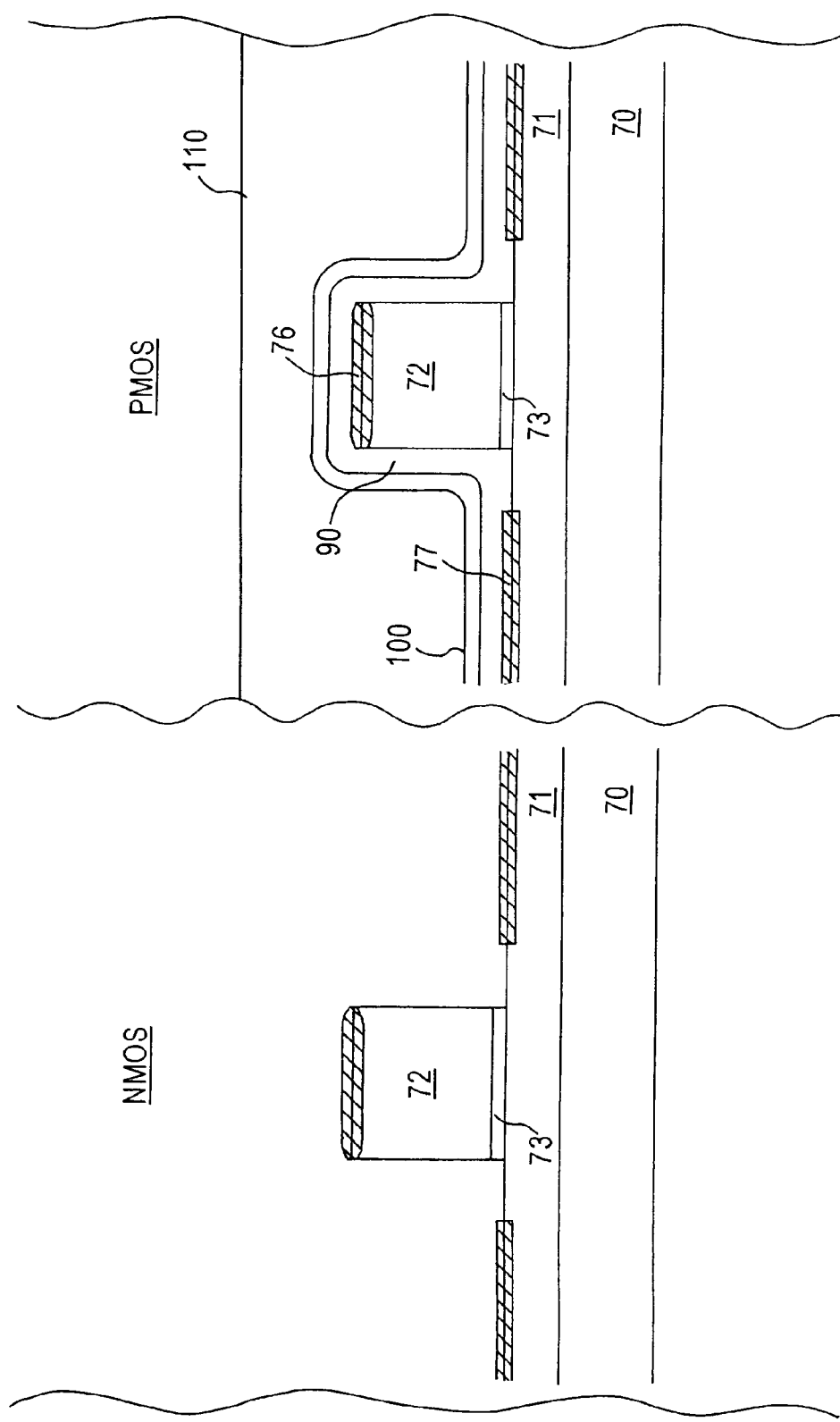

Subsequently, a mask 110, e.g., photoresist or hard mask is applied over the PMOS transistor, as illustrated in FIG. 11, and the oxide or oxynitride film 100 and high compressive stress silicon nitride film 90 removed from the NMOS transistor.

Figure 12:
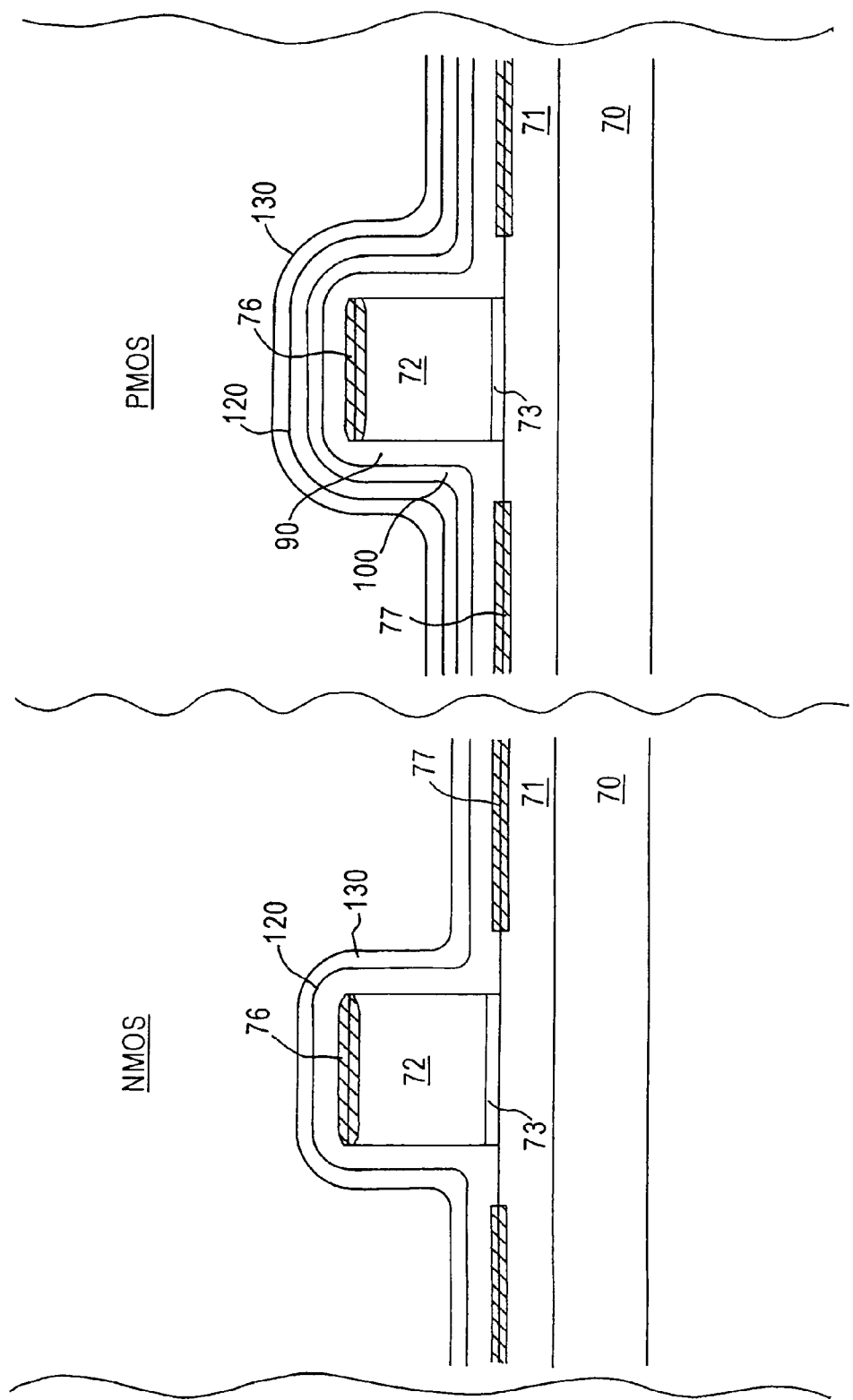

Adverting to FIG. 12, the mask 110 is removed from the PMOS transistor, a highly tensile stressed silicon nitride film 120, having a tensile stress of greater than 1.5 GPa, is then deposited over both the PMOS and NMOS transistors. Deposition of highly tensile stressed film 120 can be implemented at a temperature of about 400° C. to about 480° C., a $SiH_4$ flow rate of about 40 to about 80 sccm, and $NH_3$ flow rate of about 1,500 to about 2,500 sccm, a $N_2$ flow rate of about 20,000 to about 40,000 sccm, a spacing (between substrate and shower head) of about 400 to about 600 mils, a pressure of about 2 to about 8 Torr, a high frequency power of about 40 to about 80 watts, and a low frequency power up to about 10 watts. A thin oxide or oxynitride film 130 is then deposited by a conventional CVD process, as at a thickness of about 30 Å to about 60 Å.

Figure 13:
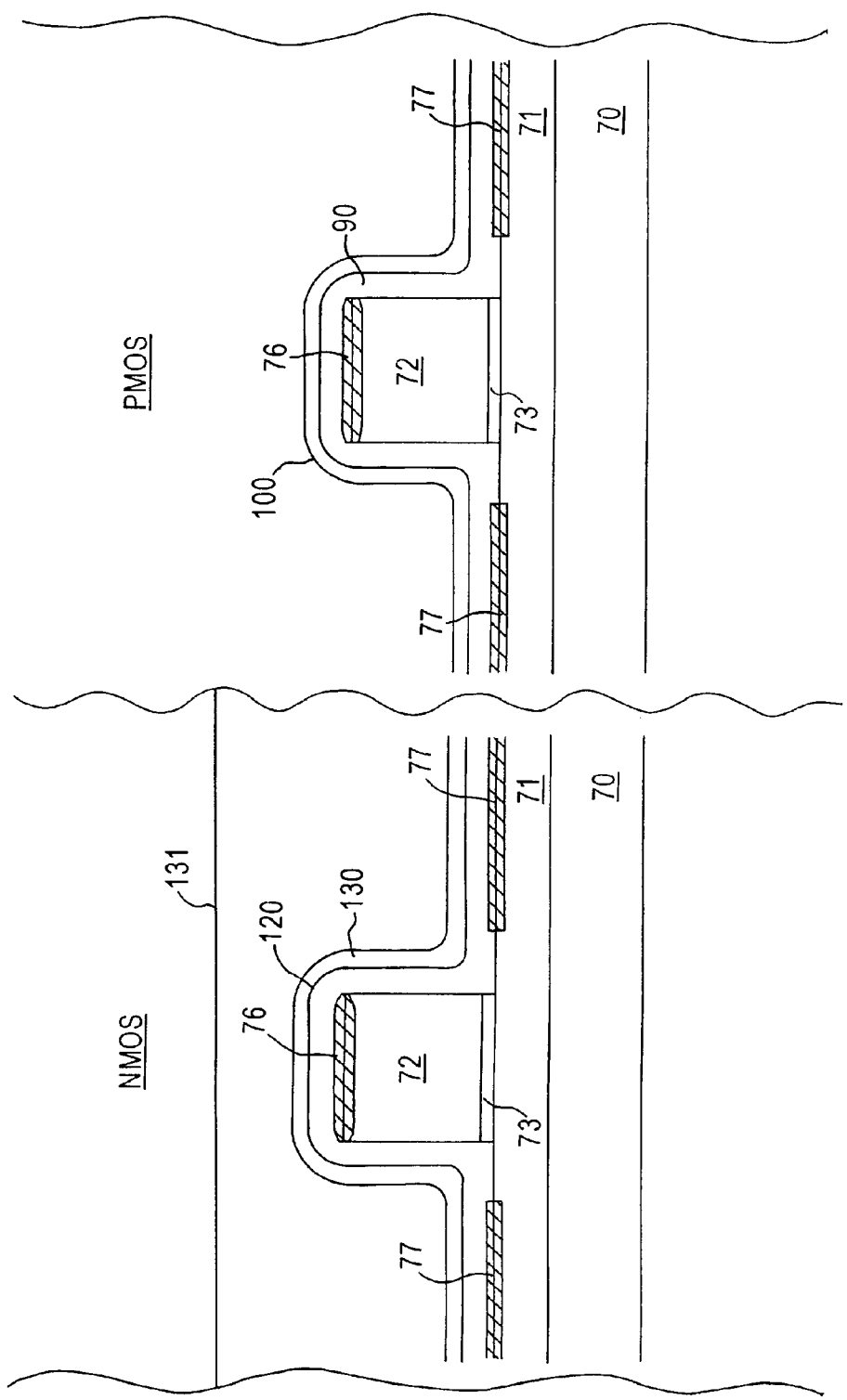
Figure 14:
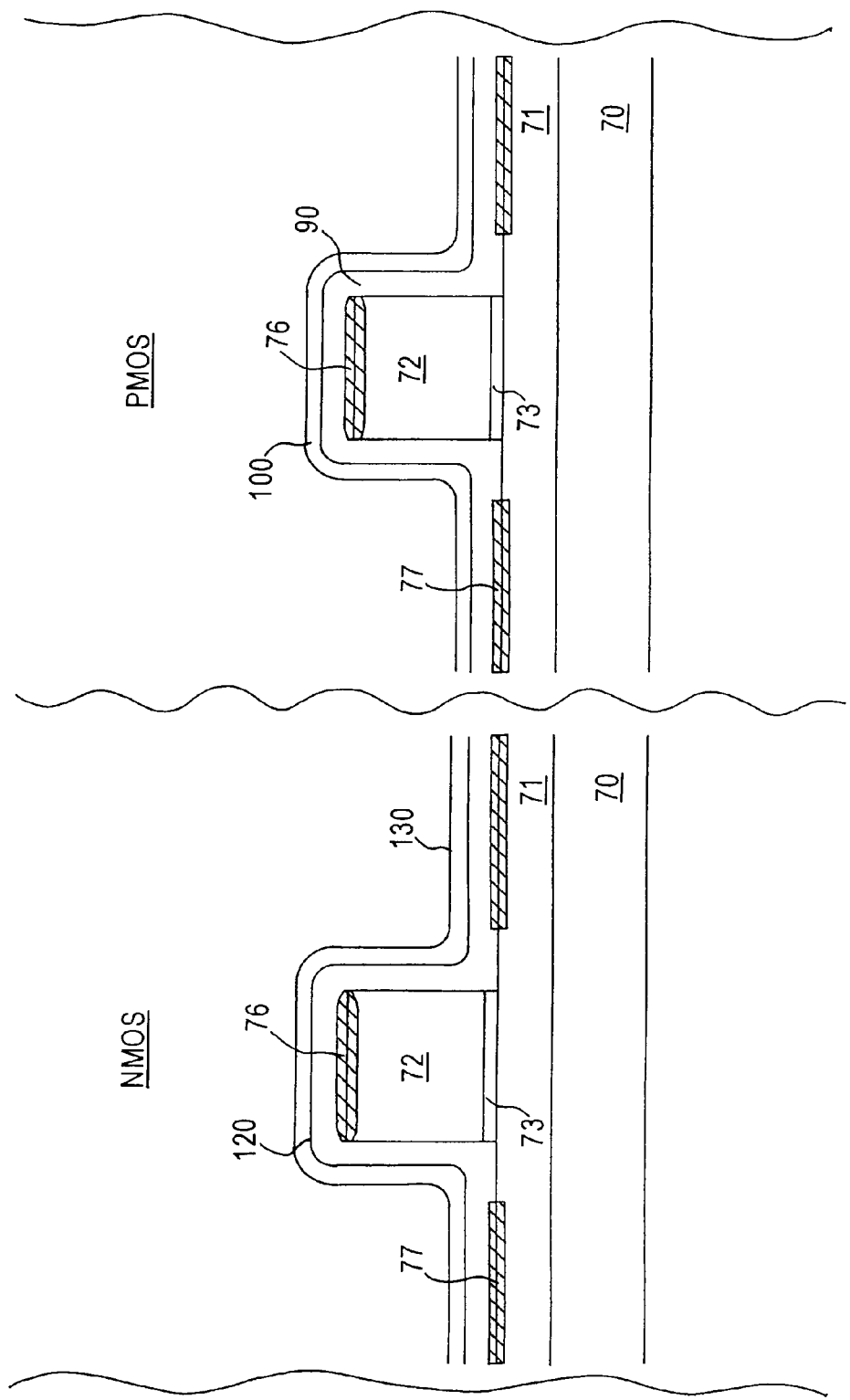

Adverting to FIG. 13, a mask 131, such as a photoresist or hard mask, is then applied over the NMOS transistor, and the oxide or oxynitride film 130 and the highly tensile stressed silicon nitride film 120 are selectively removed from the PMOS transistor stopping on the oxide or oxynitride film 100. The mask 131 is then removed, and the resulting structure is illustrated in FIG. 14 which comprises an oxide or oxynitride film 130 and a highly tensile stressed silicon nitride film 120 over the NMOS transistor and an oxide or oxynitride film 100 and a highly compressive stressed silicon nitride film 90 over the PMOS transistor. The resulting CMOS device comprises both PMOS and NMOS transistors with increased channel carrier mobility and, hence, increased drive current.

The present invention provides methodology enabling the fabrication of high quality, high operating speed, micro-miniaturized semiconductor devices based upon strained lattice technology, with maximized transistor drive currents. The inventive methodology can be practiced utilizing conventional processing techniques and instrumentalities at rates consistent with the throughput requirements of automated fabrication techniques, and is fully compatible with conventional process flow for the manufacture of high-density integrated semiconductor devices.

The present invention enjoys industrial applicability in fabricating various types of semiconductor devices. The present invention enjoys particular industrial applicability in fabricating micro-miniaturized semiconductor devices with high operating speeds.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is susceptible of changes or modifications within the scope of the inventive concept as expressed herein.

What is claimed is:

1. A semiconductor device comprising:
   a substrate comprising a layer of silicon (Si) having a strained lattice on a layer of silicon-germanium (Si–Ge);
   CMOS transistors comprising an NMOS transistor and a PMOS transistor, each transistor comprising source/drain regions and a gate electrode over the substrate with a gate dielectric layer therebetween;
   a dielectric liner, exhibiting high tensile stress, over side surfaces of the gate electrode and over the source/drain regions of the NMOS transistor: and
   a dielectric liner, exhibiting high compressive stress, over side surfaces of the gate electrode and over the source/drain regions of the PMOS transistor.

2. The semiconductor device according to claim 1, wherein the strained Si layer is either globally strained or locally strained in the source/drain regions.

3. A semiconductor device comprising:
   a substrate comprising a layer of silicon (Si) having a strained lattice on a layer of silicon-germanium (Si–Ge);
   a relaxed layer of Si grown on the strained Si layer;
   a transistor comprising source/drain regions and a gate electrode over the substrate with a gate dielectric layer therebetween; and
   a stressed dielectric liner over side surfaces of the gate electrode and over the source/drain regions,
   wherein the source/drain regions are formed in the relaxed layer of Si grown on the strained Si layer, and the stressed dielectric liner exhibits high compressive or tensile stress.

4. The semiconductor device according to claim 3, further comprising:
   dielectric sidewall spacers on side surfaces of the gate electrode; and
   a layer of metal silicide on an upper surface of the gate electrode, wherein the stressed dielectric liner is on the sidewall spacers.

5. The semiconductor device according to claim 4, wherein:
the sidewall spacers comprise an oxide liner on the side surfaces of the gate electrode and on an upper surface portion of the strained Si layer, and a nitride layer on the oxide liner; and
the stressed dielectric liner is on the nitride layer and between a bottom portion of the oxide liner and relaxed layer of Si.

6. The semiconductor device according to claim 2, wherein the dielectric liner exhibiting high tensile stress and the dielectric liner exhibiting high compressive stress each comprises silicon nitride, silicon carbide or silicon oxynitride, and has a thickness of about 200 Å to about 1000 Å.

7. The semiconductor device according to claim 2, comprising:
a first metal silicide layer on an upper surface of each gate electrode; and
a second metal silicide layer on the source/drain regions spaced apart from the side surfaces of the gate electrode leaving adjacent portions of the strained Si layer exposed, wherein:
the stressed dielectric liners are on the first metal silicide layer, side surfaces of each gate electrode and on the exposed portions of the strained Si layer; and
the source/drain regions are in the strained Si layer.

8. The semiconductor device according to claim 3, wherein:
the transistor is a P-channel transistor; and
the stressed dielectric liner exhibits high compressive stress.

9. The semiconductor device according to claim 3, wherein:
the transistor is an N-channel transistor; and
the stressed dielectric liner exhibits high tensile stress.

* * * * *

UNITED STATES PATENT AND TRADEMARK OFFICE
CERTIFICATE OF CORRECTION

PATENT NO.        : 7,053,400 B2                                             Page 1 of 1
APPLICATION NO.   : 10/838330
DATED             : May 40, 2006
INVENTOR(S)       : Sey-ping Sun et al.

It is certified that error appears in the above-identified patent and that said Letters Patent is hereby corrected as shown below:

IN THE CLAIMS,
Column 10, line1, change the phrase "on the source/drain regions" to -- on the associated source/drain regions --.

Signed and Sealed this

Thirty-first Day of October, 2006

JON W. DUDAS
*Director of the United States Patent and Trademark Office*

UNITED STATES PATENT AND TRADEMARK OFFICE
CERTIFICATE OF CORRECTION

PATENT NO.         : 7,053,400 B2                                              Page 1 of 1
APPLICATION NO. : 10/838330
DATED              : May 30, 2006
INVENTOR(S)        : Sey-ping Sun et al.

It is certified that error appears in the above-identified patent and that said Letters Patent is hereby corrected as shown below:

IN THE CLAIMS,
Column 10, line1, change the phrase "on the source/drain regions" to -- on the associated source/drain regions --.

This certificate supersedes Certificate of Correction issued October 31, 2006.

Signed and Sealed this

Nineteenth Day of December, 2006

JON W. DUDAS
*Director of the United States Patent and Trademark Office*